US007639724B2

(12) United States Patent
Tso et al.

(10) Patent No.: US 7,639,724 B2
(45) Date of Patent: Dec. 29, 2009

(54) RF CONVERTER WITH MULTIPLE MODE FREQUENCY SYNTHESIZER COMPATIBLE WITH A 48 FO GPS BASEBAND PROCESSOR

(75) Inventors: Robert Tso, Rosemead, CA (US); Noshir Dubash, Chandler, AZ (US)

(73) Assignee: SiRF Technology Inc., San Jose, CA (US)

( * ) Notice: Subject to any disclaimer, the term of this patent is extended or adjusted under 35 U.S.C. 154(b) by 814 days.

(21) Appl. No.: 10/492,277

(22) PCT Filed: Oct. 11, 2002

(86) PCT No.: PCT/US02/32581

§ 371 (c)(1),
(2), (4) Date: Oct. 20, 2004

(87) PCT Pub. No.: WO03/032514

PCT Pub. Date: Apr. 17, 2003

(65) Prior Publication Data

US 2005/0080564 A1   Apr. 14, 2005

Related U.S. Application Data

(60) Provisional application No. 60/329,460, filed on Oct. 11, 2001.

(51) Int. Cl.
*H04B 1/00* (2006.01)
(52) U.S. Cl. ............... 375/130; 375/316; 375/324; 375/327; 342/103
(58) Field of Classification Search ............... 375/130, 375/316, 324, 327; 324/103
See application file for complete search history.

(56) References Cited

U.S. PATENT DOCUMENTS 6,931,233 B1 * 8/2005 Tso et al. ............... 455/12.1
7,047,023 B1 * 5/2006 Tso ............... 455/456.6

* cited by examiner

*Primary Examiner*—Ted M Wang
(74) *Attorney, Agent, or Firm*—RatnerPrestia

(57) ABSTRACT

An RF-to-IF converter includes radio frequency (RF) to intermediate frequency (IF) processing circuitry and a frequency synthesizer for generating a local oscillator signal and clocking signals. The frequency synthesizer includes a local oscillator (LO) output coupled to the processing circuitry, a baseband processor clock output, and clock generation circuitry for generating a baseband processor clock with a frequency of approximately 48 fo on the baseband processor clock output, where fo is 1.023 MHz.

11 Claims, 4 Drawing Sheets

RF CONVERTER WITH MULTIPLE MODE FREQUENCY SYNTHESIZER COMPATIBLE WITH A 48 FO GPS BASEBAND PROCESSOR

CROSS-REFERENCE TO RELATED APPLICATIONS

This application claims the benefit of U.S. Provisional Application Ser. No. 60/329,460, titled "GPS RF-TO-DIGITAL CONVERTER WITH SYNTHESIZER HAVING DUAL PLL MODES FOR A 48 Fo BASEBAND PROCESSOR", filed Oct. 11, 2001. This application incorporates U.S. Provisional Application Ser. No. 60/329,460 herein by reference in its entirety.

BACKGROUND OF THE INVENTION

1. Field of the Invention

This invention relates a radio frequency (RF) to Intermediate Frequency (IF) converter that incorporates a frequency synthesizer with multiple modes of operation. More specifically, this invention relates to an RF to IF converter that is particularly suited for use with a satellite positioning system baseband processor using a 48 fo processing clock.

2. Related Art

The worldwide use of wireless devices such as two-way radios, pagers, portable televisions, personal communication system ("PCS"), personal digital assistants ("PDAs") cellular telephones (also known as "mobile phones"), Bluetooth, satellite radio receivers and Satellite Positioning Systems ("SPS") such as the Global Positioning System ("GPS"), also known as NAVSTAR, is growing at a rapid pace. Current trends are calling for the incorporation of SPS services into a broad range of electronic devices and systems, including Personal Digital Assistants (PDAs), cellular telephones, portable computers, automobiles, and the like.

At the same time, manufacturers design the electronic devices using very different architectures, spanning a wide variety of processors, frequency references, clock rates, and the like. For example, dedicated GPS receivers typically utilize a reference frequency oscillator having frequency that is some convenient integer multiple of fo, such as 16 fo or 24 fo, where fo is the frequency of the direct sequence spread spectrum pseudo-random code rate of 1.023 Mbits/sec. On the other hand, Global System for Mobile Communication (GSM) devices include a 13 MHz or 26 MHz reference frequency oscillator, Wideband Code Division Multiple Access (WCDMA) devices include a 15.36 MHz reference frequency oscillator, and Motorola's iDen devices include a 16.8 MHz reference frequency oscillator. The variance in architectures and specifically variation in the available reference frequency oscillators included those architectures rendered it impossible to obtain the cost and design time benefits of reusing an RF-to-IF converter designed to accept a single specific reference clock or a small number of different reference clocks.

It is noted that the TChip TJ1004 device allows an RF-to-IF converter to use either a 16 fo or 13 MHz reference frequency signal. Similarly, the SiGe Semiconductor SE4100L allows an RF-to-IF converter to use a 16 fo reference frequency signal. However, such RF-to-IF converters are not compatible with a baseband GPS processor that has a 48 fo processing clock. As a result, those RF-to-IF converters cannot be used with the invention disclosed in U.S. Pat. No. 5,897,605 that advantageously provides a spread spectrum receiver with fast signal reacquisition.

Therefore, a need exists for an RF-to-IF converter that overcomes the problems noted above and others previously experienced.

SUMMARY

Systems consistent with the invention provide an RF-to-IF converter. The IF signal provided to the baseband GPS processor may be in analog format or in digitized format. The RF-to-IF converter produces a baseband processor clock (with a frequency, for example, of 48 fo) given any one of a number of pre-selected reference frequencies. Thus, the RF-to-IF converter may be incorporated into a wide variety of electronic devices without redesigning the RF-to-IF converter, and without requiring an additional reference frequency oscillator. Furthermore, when the baseband processor clock is at 48 fo, the RF-to-IF convertor is well suited for use with the baseband GPS processor disclosed in U.S. Pat. No. 5,897,605.

In one embodiment, the RF-to-IF converter includes radio frequency (RF) to intermediate frequency (IF) processing circuitry and a frequency synthesizer. The frequency synthesizer includes a local oscillator (LO) output coupled to the processing circuitry, a baseband processor clock output, and clock generation circuitry for generating a baseband processor clock with a frequency of approximately 48 fo on the baseband processor clock output. The frequency fo is the frequency of the direct sequence spread spectrum pseudocode random code rate of 1.023 Mbits/sec.

The frequency synthesizer also produces a data acquisition clock with a frequency that is a pre-selected fraction (e.g., a rational fraction) of the baseband processor clock frequency. The data acquisition clock is coupled to an analog to digital (A/D) converter clock input in the processing circuitry. The data acquisition clock rate may, for example, be approximately one-third the clock rate of the baseband processor clock output.

The clock generation circuitry in the frequency synthesizer produces the baseband processor clock and the data acquisition clock given any of a pre-selected set of input reference frequencies. As will be explained in more detail below, the frequency synthesizer includes programmable dividers, fixed dividers, and multiplexers that provide an appropriate frequency comparison output to a phase frequency detector (PFD) in a phase locked loop (PLL). The PLL generates the LO output signal from which the baseband processor clock and the data acquisition clock are derived using integer dividers. The dividers within the PLL section may include fixed or programmable integer-n dividers or multiple-modulus dividers properly controlled to effect fractional-n dividers, with the multiple modulus divider typically implemented using an arrangement of CMOS accumulators. There are many ways to implement a fractional-N divider, and the invention herein disclosed is not limited to any specific implementation.

Other apparatus, systems, methods, features and advantages of the present invention will be or will become apparent to one with skill in the art upon examination of the following figures and detailed description. It is intended that all such additional systems, methods, features and advantages be included within this description, be within the scope of the present invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate like parts throughout the different views.

DETAILED DESCRIPTION

Reference will now be made in detail to implementations in accordance with methods and systems consistent with the present invention as illustrated in the accompanying drawings. The same reference numbers may be used throughout the drawings and the following description to refer to the same or like parts.

A typical satellite positioning system ("SPS") system has approximately 12 satellites that may be visible at any one time to a wireless device. SPS means any system utilizing satellites and/or land-based communications devices for providing or enabling the determination of a location of the wireless device on the earth, for example but not limited to: the global positioning system ("GPS") known as NAVSTAR, GLONASS, LORAN, Shoran, Decca, or TACAN. It is noted that for the purposes of discussion below, specific examples of a GPS RF-to-IF converter are described. However, the principles underlying the operation of the GPS RF-to-IF converters are applicable to SPSs in general, and to the RF signals received from the SPSs.

Figure 1:
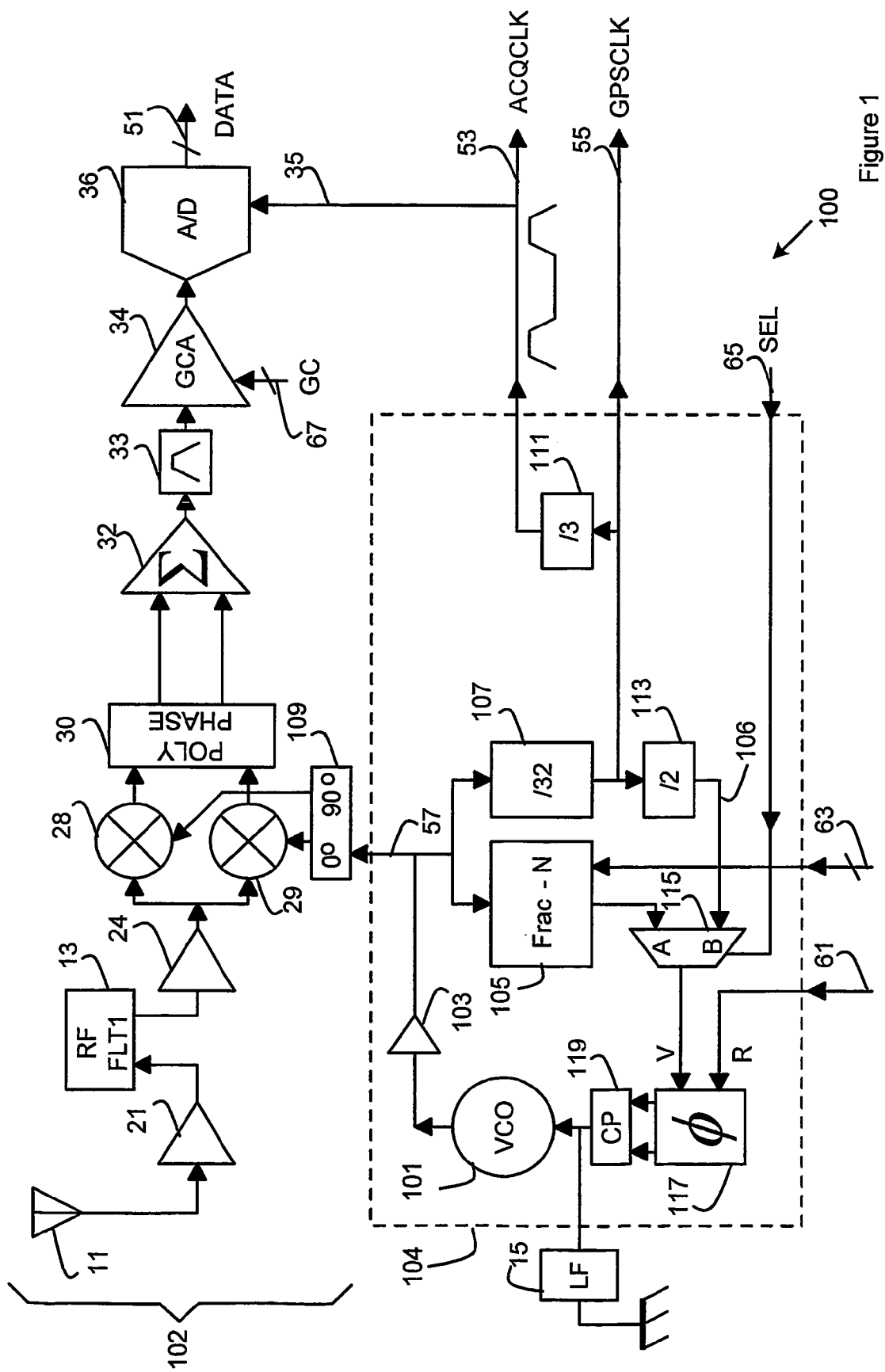
FIG. 1 illustrates a single conversion RF-to-IF converter, having integer N and fractional N PLL modes, for receiving and digitizing a satellite positioning system signal.

Turning first to FIG. 1, that figure shows an RF-to-IF converter 100. The RF-to-IF converter 100 includes radio frequency (RF) to intermediate frequency (IF) processing circuitry 102 and a frequency synthesizer 104. The processing circuitry 102 that is shown in FIG. 1 has a single conversion architecture (i.e., the architecture produces one intermediate frequency). The processing circuitry 102 includes a GPS antenna 11 coupled to a Low Noise Amplifier (LNA) 21. The LNA 21 typically provides between 10 and 30 dB of power gain at 1575.42 MHz, and typically has a noise figure of 1 to 3 dB. The RF filter 13 provides band selection, and the RF amplifier 24 amplifies the output of the RF filter 13. Many technologies may be used to implement the RF filter 13. As examples, the RF Filter 13 may be a Surface Acoustic Wave (SAW) type, Ceramic multi-pole, or lumped L-C type bandpass filter centered at 1575.42 MHz (i.e., 1540 fo), with relatively low loss (e.g., on the order of 0 to 3 dB).

The processing circuitry 102 further includes an image rejection mixer, formed from the mixers 28, 29 in conjunction with the IF Poly-Phase filter 30, signal summer 32, and the Local Oscillator (LO) quadrature generator 109. The output of the image rejection mixer is an IF signal that is subsequently filtered by the IF filter 33 and amplified by a Gain Control Amplifier (GCA) 34. It should be noted that although the figure shows the IF Poly-Phase filter 30 being placed ahead of the IF filter 33, advantage in performance may be obtained by swapping the position of these two blocks, particularly in the presence of jamming signals and if summer 32 is implemented using active circuitry. The IF filter 33 is typically a bandpass type filter, having center frequency near 4 fo, and providing a signal bandwidth ranging from 1.5 MHz to 7.5 MHz. The GCA 34 provides signal amplification within the IF bandwidth, with gain adjustable typically from about 0 dB minimum to 60 dB maximum. One or more GCA inputs 67 control the gain selection of GCA 34. These control inputs may be of an analog type or a digital type, depending on the specific design of GCA 34. The gain selection is chosen based on the desire to optimize the level of the signal relative to the quantization threshold of the analog to digital (A/D) converter 36. For digital control of the GCA 34, typically the data 51 is examined by a GPS processor, and inputs 67 are controlled by the GPS processor.

The A/D converter 36 digitizes the filtered IF signal (in synchronism with a data acquisition clock provided on the A/D clock input 35) to produce Inphase (I) and Quadrature (O) digital data on the digital data output 51. The IF center frequency is near 4 fo and the data acquisition clock "ACQ-CLK" 53 is near 16 fo. It is clear to those skilled in the art that such a frequency plan commonly referred to as "Quadrature IF Sampling" offers simplified subsequent frequency translation of samples down to baseband, as the samples of data in 51 will be in the sequence of {I, Q, −I, −Q, I, Q, . . . }. The digital data may be, as examples, one-bit (Sign only) or two-bits (Sign and Magnitude). The digital data output 51 is generally connected to a baseband GPS processor (not shown) for GPS signal filtering, detection, acquisition, tracking and other GPS signal processing functions.

Figure 2:
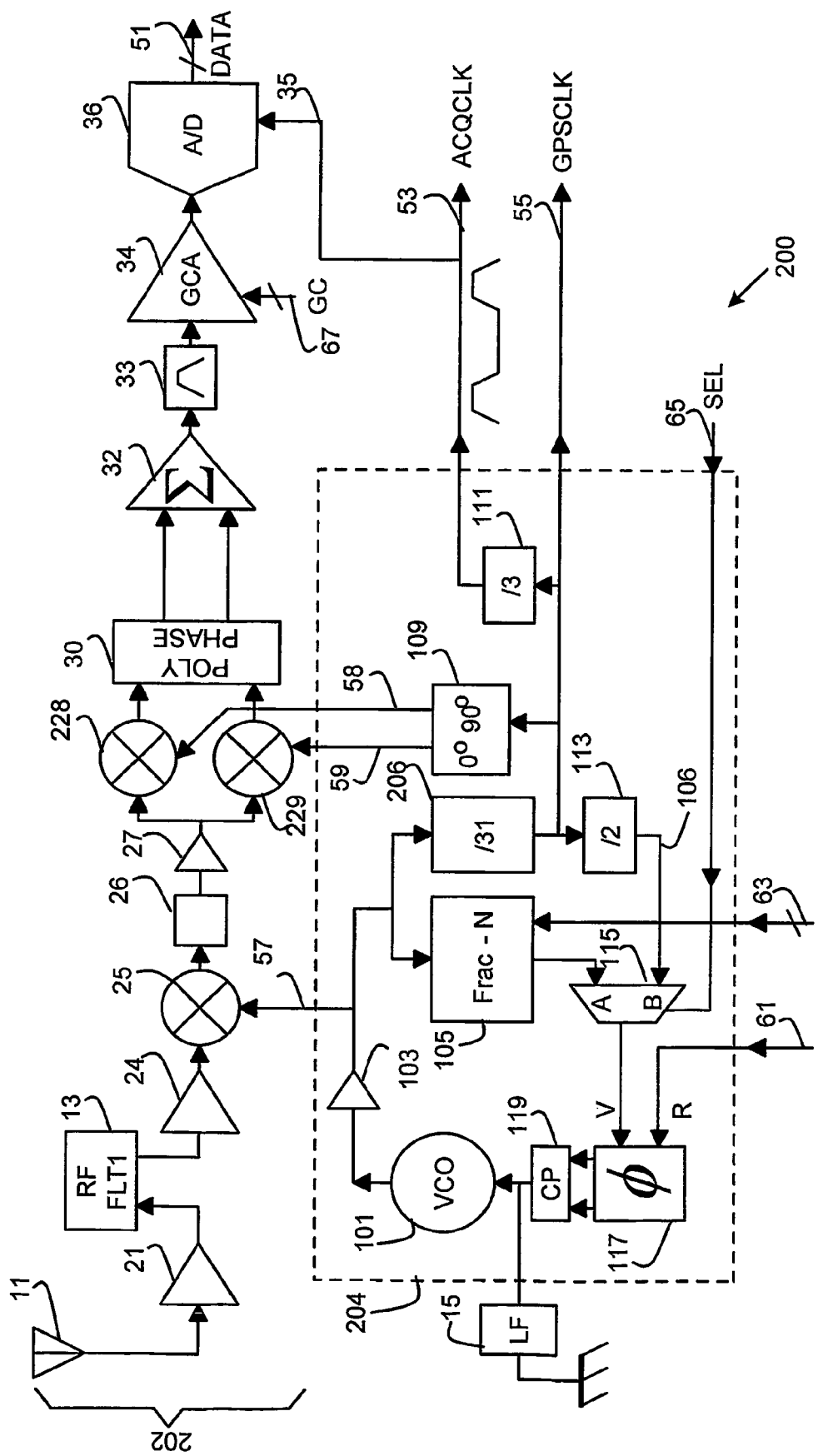
FIG. 2 depicts a dual conversion RF-to-IF converter, having integer N and fractional N PLL modes, for receiving and digitizing a satellite positioning system signal.

Turning briefly to FIG. 2, the figure shows an RF-to-IF converter 200 that, like the RF-to-IF converter 100, also includes RF to IF processing circuitry 202. However, the processing circuitry 202 is dual conversion processing circuitry 202. In other words, the processing circuitry 202 produces two different IF signals prior to outputting the digital I/Q data on the digital data output 51. The RF/IF signal path is similar to that for the processing circuitry 102 shown in FIG. 1.

To summarize, the processing circuitry 202 includes a GPS antenna 11 coupled to a Low Noise Amplifier (LNA) 21 and an RF filter 13 for band selection. The RF amplifier 24 amplifies the output of the RF filter 13. Next, however, note that the processing circuitry 202 includes a first mixer 25 followed by a first IF filter 26 and an IF buffer 27. The resultant first IF signal is coupled to the image rejection mixer that is formed from the mixers 228 and 229, the IF Poly-Phase filter 30, signal summer 32, and the LO quadrature generator 109. Due to the first stage of mixing, the signal entering the image rejection mixer in the processing circuitry 202 is much lower in frequency than the signal entering the image rejection mixer in the processing circuitry 102. Also, there is more gain preceding the image rejection mixer of FIG. 2. For these reasons, mixers 228 and 229 typically consume less power than the mixers 28 and 29 in the processing circuitry 102. In addition, the LO quadrature generator 109 operates at a much lower frequency (approximately 48 fo) instead of 1536 fo, which also reduces power and design effort.

As with the processing circuitry 102 shown in FIG. 1, the output of the image rejection mixer is an IF signal that is subsequently filtered by the IF filter 33 and amplified by a Gain Control Amplifier (GCA) 34. The analog to digital (A/D) converter 36 digitizes the filtered IF signal (in synchronism with a data acquisition clock provided on the A/D clock input 35) to produce Inphase (I) and Quadrature (O) digital data on the digital data output 51.

Before turning to a discussion of the frequency synthesizers, it is noted that the RF-to-IF converters shown in the figures provide several outputs for connection to a baseband GPS processor. In particular, the RF-to-IF converters provide a digital data output 51 (carrying quantized IF samples) and a baseband processor clock output 55. The baseband processor clock output 55 provides the master clock signal (GPSCLK) for synchronizing processing functions. In addition, the RF-to-IF converter includes a data acquisition clock output 53 that carries a data acquisition clock signal (ACQCLK) that is a pre-selected fraction (e.g., a simple rational fraction) of the GPSCLK. In one embodiment, the ACQCLK is one-third the frequency of the GPSCLK (e.g., when the GPSCLK runs at 48 fo, the ACQCLK runs at 16 fo).

Figure 3:
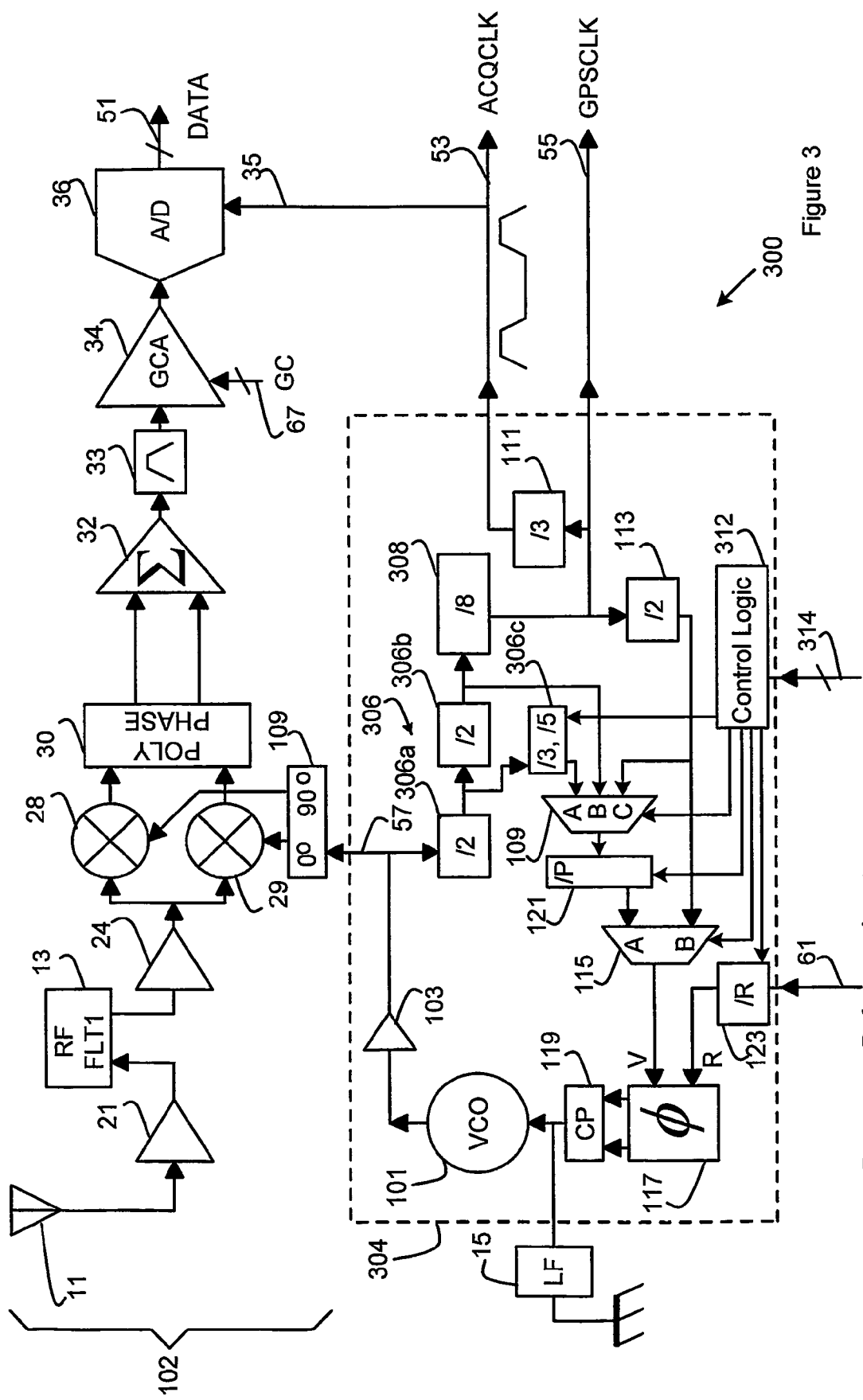
FIG. 3 illustrates a single conversion RF-to-IF converter, using integer N PLL modes, for receiving and digitizing a satellite positioning system signal.

Below, the implementations and operation of the frequency synthesizers are explained. First, with reference to FIG. 1, the frequency synthesizer 104 includes a fractional-n divider 105 and is coupled to single conversion RF to IF processing circuitry 102. With reference to FIG. 2, the frequency synthesizer 204 also includes a fractional-n divider 105 but is coupled to dual conversion RF to IF processing circuitry 202. In FIG. 3, the frequency synthesizer 304 uses integer-n dividers 306, 308, 310 and is coupled to single conversion RF to IF processing circuitry 102. For each frequency synthesizer, the expected GPS signal (received by the antenna 11) is at 1540 fo or approximately 1575.42 MHz.

In general, the programmable frequency synthesizers provide a manufacturer selectable modes of operation. For example, the manufacturer may select to use either a "GPS Centric" reference frequency signal, or a "Wireless Centric" reference frequency signal, whichever is advantageous in a particular situation. For a standalone GPS device, a crystal reference having a frequency around 16 fo or 24 fo, (i.e., 16.368 MHz or 24.5535 MHz) is generally available and convenient to use in order to facilitate a low power implementation of an integer-N frequency synthesizer, as will be seen. In cases where a GPS receiver is integrated with a wireless device (e.g., an iDen phone), the frequency synthesizers may be operated in a mode that uses a reference frequency signal typically already available in the wireless device implementation (e.g., a 13 MHz, 15.36 MHz, 16.8 MHz, 26 MHz, or other frequency signal). The frequency reference signals are generally provided by the output of a crystal oscillator (XO) or a temperature compensated crystal oscillator (TCXO). The dividers within the PLL section may include fixed or programmable integer-n dividers or multiple-modulus dividers properly controlled to effect fractional-n dividers, with the multiple modulus divider controller typically implemented using an arrangement of CMOS accumulators. There are many ways to implement a fractional-N divider, and the invention herein disclosed is not limited to any specific implementation. In the discussions below, the frequency synthesizer modes that operate with a GPS centric frequency reference are first addressed, followed by the wireless centric frequency references.

Turning first to FIG. 1, the frequency synthesizer 104 includes a frequency reference input 61 that accepts the reference clock available in the device, as well as one or more fractional-n programming inputs 63. The frequency synthesizer 104 includes phase locked loop (PLL) circuitry which may integrally contain portions of the clock generation circuitry.

The PLL circuitry includes a Phase-Frequency Detector (PFD) 117 with up/down outputs and with a reference input (labeled R) coupled to output of an integer Reference divider 121. The Reference divider input is coupled to the frequency reference input 61. The PFD 117 also has a frequency comparison input (labeled V) that is coupled to the clock generation circuitry. The PLL also includes a charge pump 119, a loop filter 15, and a Voltage Controlled Oscillator (VCO) 101 connected as shown in FIG. 1. A buffer 103 follows the VCO 101 to provide the LO output 57 that is coupled to the processing circuitry 102 (and, more particularly, to the quadrature generator 109) and to the clock generation circuitry. Although the figures show a single output out of the VCO 101, two separate outputs from VCO 101 may be used to provide improved signal isolation between the signal path circuitry and the frequency synthesizer circuitry.

The clock generation circuitry is comprised of dividers 107 and 111. The frequencies of signals ACQCLK 53 and GPSCLK 55 are $\frac{1}{96}^{th}$ and $\frac{1}{32}$th of the VCO signal 57, which has a frequency nominally close to 1536 fo. In a first mode, these dividers are used simultaneously to close the PLL loop. In a second mode, only the fractional-N divider 105 is used to close the PLL, in which case divider 113 may be powered down to reduce power.

In the first mode of operation, the frequency synthesizer 104 accepts a frequency reference substantially close to 24 fo on the frequency reference input 61 and produces a LO output signal at 1536 fo. In this case, the frequency synthesizer uses the divide-by-32 divider 107 instead of the fractional-n divider 105. To that end, the multiplexer 115 selects the "B" input (in accordance with a multiplexer control signal provided on the multiplexer control input 65) and the divide-by-R divider 123 that is optionally connected into the frequency reference input 61 (shown in FIG. 3) is bypassed or made to produce an effective value of R=1. Thus, the frequency reference input R of the PFD is at the frequency reference input of 24 fo.

The VCO 101 is set to produce an LO signal 57 at approximately 1536 fo. Recall that the received GPS RF signal sent to the mixers 28 and 29 is at 1540 fo. As a result, the mixers 28 and 29 produce an IF signal at approximately 4 fo. To generate the LO output signal 57 at 1536 fo, the dividers 107 and 113 have divide ratio values of 32 and 2 respectively. Note that 32 is a power of two (25). Using dividers with divide ratios equal to a power of 2 are advantageous for area reduction and power reduction.

Based on the 1536 fo LO output signal, the divide-by-32 divider generates the GPSCLK at 1536/32=48 fo. Similarly, the divide-by-3 divider 111 generates the ACQCLK at 48/3=16 fo. The divide-by-2 counter 113 generates a 48/2=24 fo frequency comparison output 106 that is fed back to the PLL through the B input of the multiplexer 115.

With reference to FIG. 2, the frequency synthesizer 204 uses a divide-by-31 divider 206 instead of the divide-by-32 divider 107. With a frequency reference input of 24 fo, the first LO signal 57 is set, using the VCO 101, at approximately 1488 fo. Thus, the first IF signal produced by the mixer 25 is at approximately 52 fo. Note that the frequency synthesizer 204 also provides a second LO output signal comprising the Inphase signal 59 and Quadrature signal 58 produced by the quadrature generator 109. The second LO output signal is at a frequency of approximately 48 fo. The frequency synthesizer may generate the Inphase signal 59 and Quadrature signal 58 using a variety of methods. For example, an R—C polyphase network may be used, or the signals 58 and 59 may be obtained from digital flip-flops or latches. Because the first IF at 52 fo, and the second LO output signal is at 48 fo, the second IF signal at the output of the image rejection mixer (i.e., at the output of the summer 32) is near 4 fo.

Based on the 1488 fo LO output signal, the divide-by-31 divider 206 generates the GPSCLK at 1488/31=48 fo. Similarly, the divide-by-3 divider 111 generates the ACQCLK at 48/3=16 fo. The divide-by-2 counter 113 generates a 48/2=24 fo frequency comparison output 106 that is fed back to the PLL through the B input of the multiplexer 115.

Referring to FIG. 3, the frequency synthesizer 304 is configured as an integer-n frequency synthesizer. In other words, the frequency synthesizer 304 does not include a fractional-n divider. Instead the frequency synthesizer 304 generates the desired clocks using only integer dividers. In particular, the frequency synthesizer 304 omits the fractional-n divider 105 and provides instead a divide-by-4 prescalar formed from two divide-by-2 counters 306a and 306b. The output of the divide-by-4 prescalar is coupled to the divide-by-8 counter 308, thereby providing an overall divide-by-32 divider for generating the GPSCLK, the ACQCLK (after the divide-by-3 divider 111), and the frequency comparison output 106 (after the divide-by-2 divider) 113. The output of the divide-by-2 divider 113 is coupled to the frequency comparison "V" input of the PFD 117 either directly, or through the multiplexer 115 that is switched to the "B" input. Note that when the frequency reference is 24 fo, the multiplexer 109 and the divide-by-P divider 121 are not used and may be powered down, disabled, or effectively omitted in this mode.

Based on the 1536 fo LO output signal, the divide-by-32 divider effectively formed from the dividers 306a, 306b, and 308 generates the GPSCLK at 1536/32=48 fo. Similarly, the divide-by-3 divider 111 generates the ACQCLK at 48/3=16 fo. The divide-by-2 counter 113 generates a 48/2=24 fo frequency comparison output 106 that is fed back to the PLL through the B input of the multiplexer 115.

As noted above, each RF-to-IF converter 100, 200, 300 may be used with wireless centric frequency references (i.e., frequency references that are not an exact multiple of fo). As a result, the RF-to-IF converters 100, 200, 300 may be incorporated into cellular phones or other wireless devices, share the frequency reference signal, and eliminate the need for a GPS specific oscillator, thereby reducing the cost adding GPS functionality to the device.

Generally, in applications where a wireless centric frequency references is available for the SPS receiver, the frequency synthesizers 104, 204, 304 select the "A" input of the multiplexer 115. With reference to FIGS. 1 and 2, the fractional-n divider 105 may be pre-set or programmed as shown in Table 1 to allow the frequency synthesizer to accommodate, as examples, a 13 MHz or 26 MHz frequency reference for GSM, a 15.36 MHz frequency reference for WCDMA, and a 16.8 MHz frequency reference for iDen phones. The frequency synthesizers may also accommodate other frequency references because the fractional-n divider 105 allows the effective PLL feedback divider to assume arbitrary non integer values. The fractional-n divider 105 includes a multimodulus divider, programmable dividers, programmable counters and/or accumulators, and a means to minimize or control the generation of and spectrum of the spurs which result from changing the divider modulus.

Note that the values implemented for the fractional-n divider 105 may be slightly different than those shown in Table 1. This is because it may be desirable to "tweak" the frequency plan slightly, in the event that residual spurs from the fractional-n process appear where they may cause performance degradation or be otherwise objectionable. To the end of finding a "clean" setting of the fractional-n, the R divider 123 may be set for R=2, 3, 4, and so on in order to achieve a desired or acceptable phase noise spectrum at the VCO output 57.

TABLE 1

Fractional-N values for Several Reference Frequency signals, for both Single and Dual Conversion GPS receiver topologies, for R divider 123, R = 1

| Reference Frequency (MHz) | Fractional-n divider 105 setting for single conversion RF-to-IF converter shown in FIG. 1. $f_{LO}$ = 1536 fo + 96 kHz | Fractional-n divider 105 setting for dual conversion RF-to-IF converter shown in FIG. 2. $f_{LO}$ = 1488 fo + 93 kHz |
|---|---|---|
| 13 | 120.879 | 117.102 |
| 15.36 | 102.306 | 99.109 |
| 16.8 | 93.537 | 90.614 |
| 26 | 60.439 | 58.551 |

With reference again to FIG. 3, the frequency synthesizer 304 is an integer-n (rather than fractional-n) frequency synthesizer coupled to a single conversion receiver. Nevertheless, the frequency synthesizer 304 accommodates the wireless centric frequency reference signals as well. Specifically, the control logic 312 (as commanded by the synthesizer control inputs 314) sets the integer parameters P and R for the divide-by-P divider 121 and the divide-by-R divider 123, and selects the appropriate inputs for the multiplexers 109 and 115 as explained below. The output of the multiplexer 109 is connected to the divide-by-P divider 121. The control logic 312 may be implemented in many ways, including as examples, with logic or a read only memory (ROM) responsive to the Synthesizer control inputs 314.

The parameters for each wireless centric frequency are shown below in Table 2. The "Fref" value indicates the frequency of the R input to the PFD 117. The N-Div value represents effective frequency multiplication factor of the PLL, while the Prescalar and P-divider values represents how the N-Div value is comprised and implemented by counters. The Foffset value is the difference between exactly 1536 fo and the actual LO frequency present on the LO output 57. In some applications, it is convenient to have a small amount of frequency offset in the frequency plan, however too large of an offset can result in receiver loss. The offset, either negative or positive may be used to avoid GPS processing difficulties that can occur when the LO offset goes through zero, and the offset changes polarity. Such an event may occur due to temperature induced shifts and manufacturing tolerances of the crystals used to control the reference frequency signals, particularly if the LO frequency is chosen to be nominally an exact integer multiple of fo. The selection of the multiplexers 109 and 115, and the integer R and P divide values for counters 123 and 121 respectively, are operator selectable or programmable using the fractional-n control inputs 63.

TABLE 2

Integer-N PLL Parameters and Frequencies for Frequency Synthesizer shown in FIG. 3

| Reference (MHz) | R-Divider 123 | Fref | N-Div | Prescaler | P-Divider 121 | LO 57 (MHz) | F_offset (MHz) |
|---|---|---|---|---|---|---|---|
| 13 | 7 | 1.857143 | 846 | 6 | 141 | 1571.143 | 0.19 |
| 15.36 | 13 | 1.181538 | 1330 | 10 | 133 | 1571.446 | −0.12 |

TABLE 2-continued

Integer-N PLL Parameters and Frequencies for Frequency Synthesizer shown in FIG. 3

| Reference (MHz) | R-Divider 123 | Fref | N-Div | Prescaler | P-Divider 121 | LO 57 (MHz) | F_offset (MHz) |
|---|---|---|---|---|---|---|---|
| 16.8 | 13 | 1.292308 | 1216 | 64 | 19 | 1571.446 | 0.12 |
| 26 | 14 | 1.857143 | 846 | 6 | 141 | 1571.143 | −0.12 |
| 24.5535 | 1 | 24.5535 | 64 | 64 | N/A | 1571.424 | 0.096 |
| 19.2 | 13 | 1.476923 | 1064 | 4 | 223 | 1571.446 | −0.12 |

For the case where the frequency reference present on the frequency reference input 61 is 13 MHz, the divide-by-R divider 123 is programmed for divide-by-7, divider 306c is set to divide-by-3 mode, mux 109 selects the "A" input, and the divide-by-P divider 121 is programmed for divide-by-141. The output of the divide-by-P divider 121 is provided to the "V" input of the PFD 117 either directly or through the multiplexer 115 with the "A" input selected.

For the case where the frequency reference present on the frequency reference input 61 is 26 MHz, the divide-by-R divider 123 is programmed for divide-by-14, divider 306c is set for divide-by-3 mode, and the divide-by-P divider 121 is programmed for divide-by-141. The output of the divide-by-P divider 121 is provided to the "V" input of the PFD 117 either directly or through the multiplexer 115 with the "A" input selected.

For the case where the frequency reference present on the frequency reference input 61 is 15.36 MHz, the divide-by-R divider 123 is programmed for divide-by-13, divider 306c is set to divide-by-5 mode, multiplexer 109 selects the "A" input, and the divide-by-P divider 121 is programmed for divide-by-133. The output of the divide-by-P divider 121 is provided to the "V" input of the PFD 117 either directly or through the multiplexer 115 with the "A" input selected.

For the case where the frequency reference present on the frequency reference input 61 is 16.8 MHz, the divide-by-R divider 123 is programmed for divide-by-13, and the divide-by-P divider 121 is programmed for divide-by-19. The multiplexer 109 selects its "C" input, and counter 113 is active. The output of the divide-by-P divider 121 is provided to the "V" input of the PFD 117 either directly or through the multiplexer 115 with the "A" input selected. In this case, divider 306c is not used and may be powered down.

For the case where the frequency reference present on the frequency reference input 61 is 19.2 MHz, the divide-by-R divider 123 is programmed for divide-by-13, and the divide-by-P divider 121 is programmed for divide-by-266. The multiplexer 109 selects its "B" input, and counter 113 is not active. The output of the divide-by-P divider 121 is provided to the "V" input of the PFD 117 either directly or through the multiplexer 115 with the "A" input selected. In this case, dividers 306a and 306b function as a divide-by-4 prescaler.

The RF-to-IF converter 300, incorporating the integer-n frequency synthesizer 304, is generally less complex and requires less power than the RF-to-IF converters that incorporate the fractional-n frequency synthesizers 104 and 204. However, the fractional-n frequency synthesizers 104 and 204 may accommodate many other frequency references, should they be present in new devices, due to their ability to be programmed with fractional real numbers having a resolution limited only by the number of bits implemented in the digital accumulators the form the control section of the fractional-n divider 105.

Figure 4:
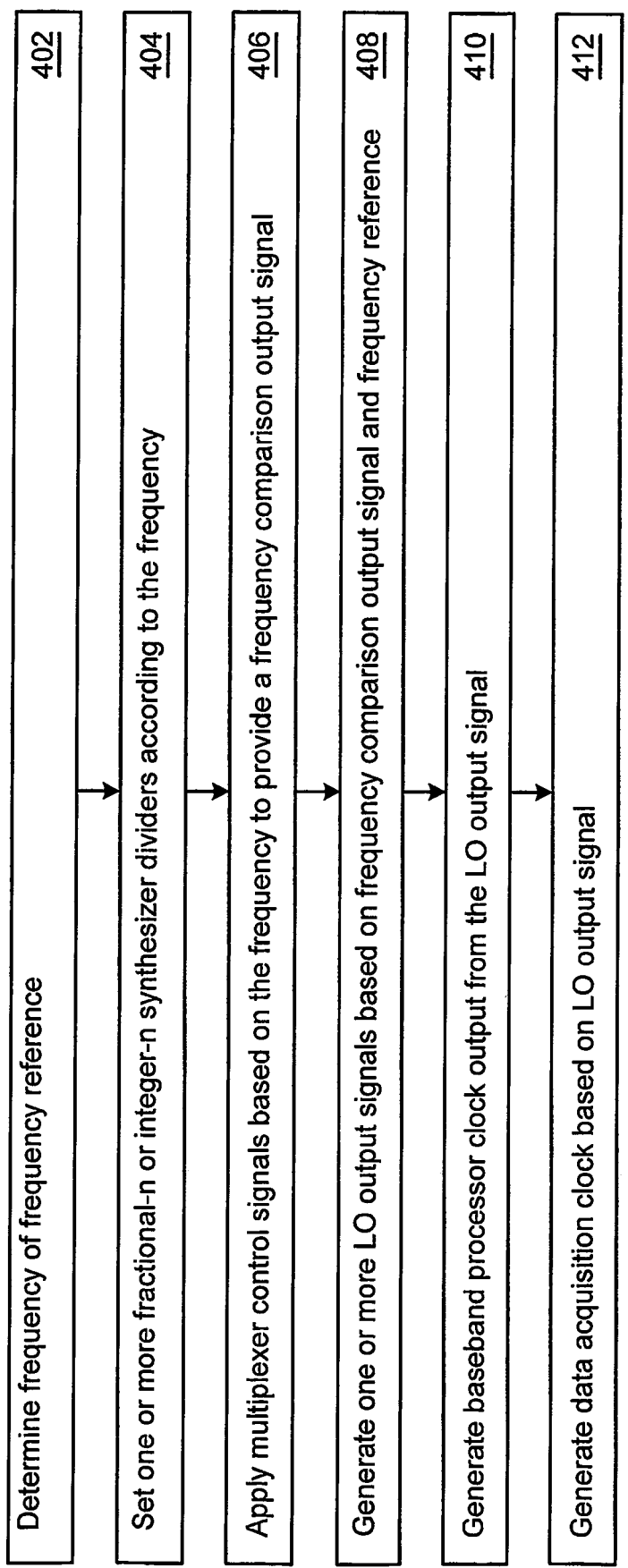
FIG. 4 shows a method for generating a baseband processor clock output signal.

FIG. 4 summarizes a method 400 for generating a baseband processor clock output signal. First, a frequency of the frequency reference signal is determined (Step 402). As noted above, as examples, the frequency may be 24 fo, 13 MHz, 26 MHz, 15.36 MHz, 16.8 MHz, or another frequency. In response, a control mechanism sets one or more dividers in the frequency synthesizer in accordance with the frequency (Step 404). Thus, the fractional-n programming inputs 63 and the control logic inputs 314 may set the dividers 105, 121, and 123 as shown above in Tables 1 and 2.

In addition, based on the frequency, a control mechanism applies one or more multiplexer control signals to provide a frequency comparison output signal (Step 406). To that end, the control logic 312 and selection input 65 may control the multiplexers 109 and 115 to select an appropriate frequency comparison output signal for the PLL as shown above in Tables 1 and 2. The PLL generates a LO output signal 57 and the clock generation circuitry may generate a second LO output signal 58, 59 in certain embodiments (as shown in FIG. 2) (Step 408). Furthermore, the clock generation circuitry generates the GPSCLK 55, for example at 48 fo, from the LO output signal (Step 410). The clock generation circuitry also generates the ACQCLK 53, for example using a pre-selected divide-by-n divider coupled to the GPSCLK 55 (Step 412).

The state of the multiplexers, and that of the counters are a predetermined function of the reference frequency that will be made available to the SPS RF-to-IF converter. Thus, there are numerous methods by which these states may be set These logic states may be hardwired, programmed by fusible links during test, or software controlled and loaded during power up initialization.

In summary, several different RF-to-IF converters have been described. A first RF-to-IF converter 100, uses a single conversion architecture, while a second RF-to-IF converter 200 incorporates a dual conversion architecture. For both architectures, the frequency synthesizers may be implemented either as fractional-n based, or integer-n based frequency synthesizers. In addition, the RF-to-IF converters are electronically adaptable to multiple external reference frequency signals. The RF-to-IF converters thereby allow a single design to function in a multitude of systems, including GPS centric and a wide range of wireless centric products having different available reference frequency signals.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description.

We claim:

1. An RF-to-IF converter comprising:
radio frequency (RF) to intermediate frequency (IF) processing circuitry; and
a frequency synthesizer comprising:
a local oscillator (LO) output coupled to the processing circuitry;
a baseband processor clock output; and
clock generation circuitry coupled to the LO output, for generating a baseband processor clock with a frequency of approximately 48 fo on the baseband processor clock output, where fo is 1.023 MHz, wherein the clock generation circuitry further comprises a divide-by-2 counter and a multiplexer, the divide-by-2 counter comprising an input coupled to the output of the divide-by-32 counter and an output coupled to the multiplexer.

2. The RF-to-IF converter of claim 1, wherein the frequency synthesizer further comprises a phase frequency detector (PFD), and wherein the multiplexer is coupled to the PFD.

3. The RF-to-IF converter of claim 1, wherein the frequency synthesizer further comprises a frequency comparison output, and further comprising a phase frequency detector (PFD) coupled to the frequency comparison output.

4. The RF-to-IF converter of claim 3, further comprising a frequency reference input coupled to the PFD.

5. The RF-to-IF converter of claim 4, wherein the frequency reference input is coupled to the PFD through a programmable divider.

6. The RF-to-IF converter of claim 1, further comprising a frequency reference input and wherein the clock generation circuitry comprises a programmable divide-by-n counter for producing the baseband processor clock from any of a preselected set of frequency references to be applied to the frequency reference input.

7. The RF-to-IF converter of claim 6, wherein the preselected set of frequency references includes at least one of a 24 fo, 13 MHz, 15.36 MHz, 16.8 MHz, and 26 MHz frequency reference.

8. The RF-to-IF converter of claim 6, wherein the preselected set of frequency references includes at least two of a 24 fo, 13 MHz, 15.36 MHz, 16.8 MHz, and 26 MHz frequency reference.

9. The RF-to-IF converter of claim 6, wherein the programmable divide-by-n counter is a programmable fractional-n divider.

10. The RF-to-IF converter of claim 6, wherein the programmable divide-by-n counter is a programmable integer-n divider.

11. The RF-to-IF converter of claim 6, further comprising at least one programmable counter control input.

* * * * *

UNITED STATES PATENT AND TRADEMARK OFFICE
CERTIFICATE OF CORRECTION

PATENT NO. : 7,639,724 B2  Page 1 of 1
APPLICATION NO. : 10/492277
DATED : December 29, 2009
INVENTOR(S) : Robert Tso and Noshir Dubash It is certified that error appears in the above-identified patent and that said Letters Patent is hereby corrected as shown below:

Column 4, line 14 "(O)" should be --(Q)--

Column 4, line 60 "(O)" should be --(Q)--

Column 6, line 33 "(25)" should be --($2^5$)--

Signed and Sealed this

Thirteenth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,639,724 B2
APPLICATION NO. : 10/492277
DATED : December 29, 2009
INVENTOR(S) : Robert Tso and Noshir Dubash It is certified that error appears in the above-identified patent and that said Letters Patent is hereby corrected as shown below:

In the Specification:
Column 2, line 29, the word "code" should be omitted.

Signed and Sealed this

Thirty-first Day of August, 2010

David J. Kappos
*Director of the United States Patent and Trademark Office*